(12) United States Patent
Shibata et al.

(10) Patent No.: US 7,771,849 B2
(45) Date of Patent: Aug. 10, 2010

(54) METHOD OF REDUCING DISLOCATIONS IN GROUP III NITRIDE CRYSTAL, AND SUBSTRATE FOR EPITAXIAL GROWTH

(75) Inventors: Tomohiko Shibata, Akika (JP); Shigeaki Sumiya, Nagoya (JP)

(73) Assignees: NGK Insulators, Ltd., Nagoya (JP); Dowa Electronics Material Co., Ltd., Chiyoda-Ku (JP)

( * ) Notice: Subject to any disclaimer, the term of this patent is extended or adjusted under 35 U.S.C. 154(b) by 0 days.

(21) Appl. No.: 12/354,921

(22) Filed: Jan. 16, 2009

(65) Prior Publication Data
US 2009/0136780 A1    May 28, 2009

Related U.S. Application Data

(63) Continuation of application No. PCT/JP2007/064227, filed on Jul. 19, 2007.

(30) Foreign Application Priority Data
Jul. 19, 2006   (JP) .............................. 2006-196528

(51) Int. Cl.
*B32B 9/00*   (2006.01)
*C30B 15/14*   (2006.01)

(52) U.S. Cl. ..................... 428/698; 428/701; 428/702; 117/2; 117/3

(58) Field of Classification Search ................. 428/688, 428/689, 697–702, 704; 438/725; 117/2, 117/3, 9, 101; 257/E21.001, E21.002, 103, 257/629
See application file for complete search history.

(56) References Cited

U.S. PATENT DOCUMENTS 6,744,076 B2 *   6/2004   Fukuyama et al. .......... 257/103

(Continued)

FOREIGN PATENT DOCUMENTS

EP   1 614 775 A2   1/2006

(Continued)

OTHER PUBLICATIONS

Fan et al., Defect annihilation in AlN thin films by ultrahigh temperature processing, Apr. 3, 2000, Applied Physics Letters, 76(14), p. 1839-1841.*

(Continued)

*Primary Examiner*—Timothy M Speer
(74) *Attorney, Agent, or Firm*—Burr & Brown

(57) ABSTRACT

An epitaxial substrate including a single-crystal base material and an upper layer of a group III nitride crystal film which is epitaxially formed on a main surface of the base material undergoes heating treatment in a nitrogen atmosphere at 1950° C. or higher for one minute. The result showed that, while a γ-ALON layer was formed only at the interface between the base material and the upper layer, the dislocation density in the group III nitride crystal was reduced to one tenth or less of the dislocation density before the heating treatment. The result also showed that the surface of the epitaxial substrate after the heating treatment had a reduced number of pits, which confirmed that high-temperature and short-time heating treatment was effective at improving the crystal quality and surface flatness of the group III nitride crystal.

6 Claims, 1 Drawing Sheet

U.S. PATENT DOCUMENTS

| | | |
|---|---|---|
| 2003/0019423 A1 | 1/2003 | Ramdani et al. |
| 2003/0176001 A1 | 9/2003 | Fukuyama et al. |
| 2004/0185666 A1 | 9/2004 | Fukuyama et al. |
| 2005/0059257 A1 | 3/2005 | Fukuyama et al. |
| 2005/0287774 A1* | 12/2005 | Shibata et al. ............... 438/502 |
| 2008/0242060 A1* | 10/2008 | Kosaka et al. ............... 438/478 |

FOREIGN PATENT DOCUMENTS

| | | |
|---|---|---|
| JP | 61-260625 A1 | 11/1986 |
| JP | 02-141495 A1 | 5/1990 |
| JP | 2004-137142 A1 | 5/2004 |
| JP | 2005-104829 A1 | 4/2005 |

OTHER PUBLICATIONS

Amano et al., Heteroepitaxial growth and the effect of strain on the luminescent properties of GaN films on (11-20) and (0001) sapphire substrates, Aug. 1988, Japanese Journal of Applied Physics, 27(8), p. L1384-L1386.*

Vispute et al., "Solid phase epitaxial recrystallization of AlN films on sapphire (0001): A novel substrate approach for GaN epitaxy," Materials Research Society Symposium Proceedings, 2000, vol. 587, pp. 07.4.1-6.

Nakao et al., "Single crystalline AlN film formed by direct nitridation of sapphire using aluminum oxynitride buffer," Journal of Crystal Growth, 2003, vol. 259, pp. 302-308.

* cited by examiner

US 7,771,849 B2

METHOD OF REDUCING DISLOCATIONS IN GROUP III NITRIDE CRYSTAL, AND SUBSTRATE FOR EPITAXIAL GROWTH

TECHNICAL FIELD

The present invention relates to a technique for reducing dislocations in a group III nitride crystal, and in particular to a technique for reducing dislocations in a group III nitride crystal that forms a surface layer of a substrate for crystal growth of group III nitrides.

BACKGROUND ART OF THE INVENTION

Group III nitride crystals are used as a material for photonic devices, electronic devices, and other semiconductor elements. Those semiconductor elements are generally in such a form that a group III nitride film serving as a device functional layer is formed on a substrate having a group III nitride crystal of high crystal quality on its surface (hereafter referred to as a "group-III-nitride-crystal substrate").

In view of crystal quality, manufacturing cost, and other problems, the group-III-nitride-crystal substrate is generally available in a form of what is called an epitaxial substrate in which a group III nitride crystal is epitaxially formed on a given single-crystal base material to approximately 10 µm at most (to such an extent that no warpage can occur due to a difference in thermal expansion coefficient). Typical methods for forming such a substrate include MOCVD (metal-organic chemical vapor deposition), MBE (molecular beam epitaxy), and other thin-film deposition techniques.

The technique for heating a single-crystal sapphire substrate in a $N_2$-CO mixed gas at high temperatures to thereby simultaneously form an aluminum oxynitride layer (ALON layer) and an AlN layer on the single-crystal sapphire substrate are already well-known for formation of the group-III-nitride-crystal substrate (cf., for example, Japanese Patent Application Laid-open Nos. 2004-137142 and 2005-104829). It is, however, noted that the methods disclosed in Japanese Patent Application Laid-open Nos. 2004-137142 and 2005-104829 have allowed the formation of an AlN layer, but that both Japanese Patent Application Laid-open Nos. 2004-137142 and 2005-104829 have neither disclosed nor suggested any specific technique for achieving good surface flatness in a group III nitride crystal. Japanese Patent Application Laid-open No. 2004-137142 has merely exemplified the presence of roughness of the order of 400 nm, at most, in the sapphire substrate after formation of the AlN layer.

In order for a device functional layer to have good device characteristics, it is necessary to reduce, as much as possible, dislocations that may propagate from the group-III nitride-crystal substrate to the device functional layer. In particular, since in those devices that use an epitaxial substrate, dislocations can occur due to a difference in lattice constant (due to lattice mismatch) at the interface between a base material and a group III nitride crystal, thread through a group III nitride film which is a device functional layer, and mostly propagate into the surface, then it is necessary to prevent this from happening. Reducing those dislocations can allow for, for example, an improvement in luminous efficiency for light-emitting devices, and a reduction in dark current for light-receiving devices. Further for electronic devices, an improvement in mobility can be allowed for.

The inventor of the present invention has found out that high-temperature heat treatment of an epitaxial substrate could improve the substrate-surface flatness and that such heat treatment could reduce dislocations in a group III nitride crystal, which fact is now already well known (cf., for example, the specification of European Patent Publication No. 1614775).

At the time of creating the invention relating to the method for improving the crystal surface flatness of a group III nitride crystal disclosed in the specification of European Patent Publication No. 1614775, the inventor of the present invention had made the inference that in achieving the effect of reducing dislocations in addition to improving the surface flatness of an epitaxial substrate, since the epitaxial substrate were going to undergo heat treatment for achieving a thermal equilibrium state, longer heat treatment time would be desirable.

The inventor of the present invention had also considered at the same time that, since the method for improving flatness disclosed in the specification of European Patent Publication No. 1614775 is to take advantage of the regularity of crystalline arrangement of a single-crystal base material, thereby improving the crystal quality of a group III nitride crystal which is an upper layer formed on the base material, the base material would preferably be made of a material that would neither decompose nor melt in the temperature zone for heat treatment or that would not react strongly with a group III nitride crystal that forms an upper layer. This was because of the necessity of avoiding the occurrence of disorder in the crystalline arrangement of the base material during heat treatment.

It had also been considered preferable that the base material and the upper layer would produce no remarkable reaction product thereof at their interface during heat treatment, and more specifically either that there be no presence of reaction products at their interface after heat treatment, or that even in the presence of a reaction product, the thickness of the reaction product be not more than one tenth of the thickness of the upper layer. This is because the thickness of a reaction product above this range could result in a risk of degradation of the surface flatness of the upper layer.

The inventor of the present invention had thus concluded that those cases, where heat treatment had produced an ultra-thin reaction product across or partly across the interface between the base material and the upper layer, were not exclusively excluded from the invention relating to the method of improving crystal surface flatness disclosed in the specification of European Patent Publication No. 1614775.

SUMMARY OF THE INVENTION

However, after further consideration, the inventor of the present invention has found out that it is possible to reduce dislocations in a group III nitride crystal without following the limitations described above. The inventor has also confirmed that such a method would not degrade the surface flatness.

The present invention has been made in view of the problems described above and has an object to provide a method of reducing dislocations in a group III nitride crystal that forms an upper layer of an epitaxial substrate.

To solve the aforementioned problems, according to a first aspect of the present invention, the method of reducing dislocations in a group III nitride crystal which is epitaxially formed on a given single-crystal base material includes a heating step of heating the group III nitride crystal, wherein in the heating step, heating at a heating temperature that may produce a reaction product of the group III nitride crystal with the single-crystal base material is conducted for a heating time within a range that the reaction product formed will not reach the surface of the group III nitride crystal.

According to the first aspect, the heating at a heating temperature that may produce a reaction product of the group III nitride crystal that forms the upper layer with the base material is performed on the epitaxial substrate for a heating time within a range that the reaction product formed will not reach the surface of the epitaxial substrate, i.e., the surface of the upper layer. This brings about the effect of reducing dislocations without degrading the flatness of that surface.

According to a second aspect, in the method of reducing dislocations according to the first aspect, the single-crystal base material is a sapphire single crystal.

In the second aspect, the heating at a heating temperature that may produce a reaction product of the group III nitride crystal that forms the upper layer with sapphire which is the base material is performed on the epitaxial substrate for a heating time within a range that the reaction product formed will reach the surface of the epitaxial substrate, i.e., the surface of the upper layer. This brings about the effect of reducing dislocations without degrading the flatness of that surface.

According to a third aspect, in the method of reducing dislocations according to the second aspect, the single-crystal base material is a C-plane sapphire single crystal.

In the third aspect, the heating at a heating temperature that may produce Al-oxynitride, such as γ-ALON, as a reaction product of an AlN- or Al-rich group III nitride crystal that forms the upper layer with sapphire which is the base material is performed on the epitaxial substrate for a heating time within a range that the oxynitride formed will not reach the surface of the epitaxial substrate, i.e., the surface of the upper layer. This brings about the effect of reducing dislocations without degrading the flatness of that surface.

According to a fourth aspect, in the method of reducing dislocations according to the second aspect, the proportion of Al to all group III elements in the group III nitride crystal is 80% by mole or more.

According to a fifth aspect, in the method of reducing dislocations according to the fourth aspect, the group III nitride crystal is AlN.

According to a sixth aspect, a substrate for epitaxial growth includes a given single-crystal base material, and an upper layer of a group III nitride crystal which is epitaxially formed on the single-crystal base material, wherein the upper layer is formed by undergoing heating treatment at a heating temperature that may produce a reaction product of the group III nitride crystal with the single-crystal base material; and for a heating time within a range that the reaction product formed will reach the surface of the group III nitride crystal.

In the sixth aspect, the heating at a heating temperature that may produce a reaction product of the group III nitride crystal that forms the upper layer with the base material is conducted for a heating time within a range that the reaction product formed will not reach the surface of the epitaxial substrate, i.e., the surface of the upper layer. This brings about the effect of reducing dislocations without degrading the flatness of that surface.

DETAILED DESCRIPTION OF THE INVENTION

Outline

Figure 1:
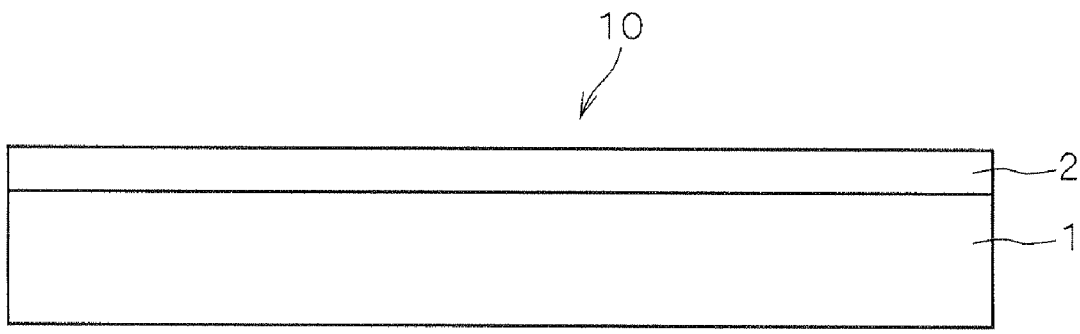
FIG. 1 is a schematic cross-sectional view illustrating the structure of an epitaxial substrate 10.

Semiconductor elements using a group III nitride semiconductor material are obtained by epitaxial deposition of a semiconductor element layer as its functional layer on an epitaxial substrate that has a group III nitride crystal as its surface layer. In order to improve the crystal quality of those semiconductor elements, improving the quality of the group III nitride crystal that forms the epitaxial substrate is effective. A method of reducing dislocations according to a preferred embodiment of the present invention, which is described hereafter, is a technique for achieving such an improvement in the quality of a group III nitride crystal.

More specifically, the method of reducing dislocations according to the present invention reduces the dislocation density in a group III nitride crystal that forms a group-III-nitride-crystal substrate, thereby having the effect of reducing remaining dislocations that had penetrated into a semiconductor element layer. This method of reducing dislocations also has the effect of suppressing degradation in the surface flatness due to the generation of pits or the like at the surface of a group-III-nitride-crystal substrate; therefore, it is possible to suppress regeneration of dislocations at the interface between the group-III-nitride-crystal substrate and the semiconductor element layer. In using a group-III-nitride-crystal substrate for formation of a semiconductor element, it is preferable that the surface roughness in the group-II-nitride-crystal substrate be to such an extent that there is such flatness (atomic-level flatness) that atomic level steps can be observed clearly, and more specifically that the 5-μm-square surface roughness (ra) measured by AFM be 10 Å or less. Or, the number of pits within a 5-μm-square area measured by AFM should preferably be 1 or less.

Epitaxial Substrate

FIG. 1 is a schematic cross-sectional view of an epitaxial substrate 10 that includes as its upper layer 2 a group III nitride crystal to which the method of reducing dislocations according to the preferred embodiment of the present invention is applicable. For convenience of illustration, the ratio between the thicknesses of each layer and the ratio between vertical and horizontal scales are not necessarily reflect the actual ratios.

The upper layer 2 is formed on a base material 1 of single-crystal sapphire. The upper layer 2 is an epitaxial film of a group III nitride crystal formed by well-known film deposition techniques such as MOCVD, MBE, HVPE (hydride vapor phase epitaxy), or sputtering. The MOCVD may be used in combination with a PALE (pulsed atomic layer epitaxy) technique, a plasma-assisted technique, a laser-assisted technique, or other techniques. The MBE may also be used in combination with the same kinds of techniques. The growth techniques such as MOCVD and MBE that have high-precision control over the manufacturing conditions are suitable for growth of high-quality crystals. On the other hand, the HVPE technique that allows a one-time large amount of supply of a raw material is suitable for short-time growth of thick films. In forming the upper layer 2, those techniques may be used in combination.

The upper layer 2 generally include dislocations at a density of approximately $1 \times 10^9 / cm^2$ or more. In a group III nitride crystal, there can be two types of dislocations, namely screw dislocations and edge dislocations; the upper layer 2 mainly contains edge dislocations. Group III nitride crystals refer to crystals having the composition represented by $B_xAl_yGa_zIn_{1-x-y-z}N$ (where $x \geq 0$, $y \geq 0$, and $z \geq 0$) and having a wurtzite or a zinc blend structure. The thickness of the upper layer 2 is not specifically limited and an optimum thickness will be selected for end-use device structure or usage pattern. For instance, a thickness of the order of several nanometers to several millimeters is estimated. The composition of the upper layer 2 exhibits an average composition and it is not necessarily completely uniform; for instance, it may be a graded composition or may have a stress relaxation film with a different composition inserted therein.

The upper layer 2 may, in some cases, contain impurities, such as H, C, O, Si, or transition metals, that are inevitably introduced upon formation of the upper layer 2, or in other cases, may contain impurities such as Si, Ge, Be, Mg, Zn, or Cd that are intentionally introduced for conductivity control.

The base material 1 is, as previously described, made of a single-crystal sapphire. In producing the upper layer 2 from a group III nitride crystal with its main surface in the (0001) plane, for example (11-20) or (0001) sapphire can be used as the base material 1. In producing the upper layer 2 from a group III nitride crystal with its main surface in the (11-20) plane, for example (10-12) sapphire can be used as the base material 1. The thickness of the base material 1 is not specifically limited in terms of material quality, but it should preferably be in the range of several hundred micrometers to several millimeters for convenient handling.

Heat Treatment

The present preferred embodiment achieves a reduction of dislocations in a group III nitride crystal that forms the upper layer 2 through heat treatment in which the epitaxial substrate 10 is heated with given treatment equipment. For instance, the dislocation density is reduced to about one tenth or less. In particular, edge dislocations can effectively be caused to coalesce and disappear. The heat treatment is also effective to some extent at eliminating pits at the surface.

The heat treatment is such that heating at a heating temperature that may produce a reaction product of the group III nitride crystal that forms the upper layer 2 with the base material 1 of single-crystal sapphire is conducted for a heating time within a range that the reaction product formed will not reach the surface of the epitaxial substrate 10, i.e., the surface of the upper layer 2. This is because, the higher the heating temperature, the more efficiently short-time heat treatment can bring about the effect of reducing dislocations, and also because, even if part of the upper layer 2 ends in the reaction product, as long as the upper layer 2 as the surface layer of the epitaxial substrate 10 keeps such sufficient surface flatness that allows a group III nitride crystal which serves as a semiconductor element layer to grow with good crystal quality on the upper layer 2, there is substantially no problem. It is, however, preferable that at least the surface conditions before heat treatment be maintained without degradation. More specifically, if the upper layer 2 keeps such surface flatness that atomic-level steps can be formed, the epitaxial substrate 10 after the heat treatment will suitably be used for formation of a semiconductor element layer.

For example when the upper layer 2 is made of AlN, heating at a temperature of 1700° C. or higher may produce γ-ALON by the reaction of AlN with the base material 1 of sapphire; however, heating at 1800° C. for about 60 minutes or at 1900° C. for about 10 minutes can reduce dislocations in the group III nitride crystal that forms the upper layer 2 to a density of $1\times10^9/cm^2$ or less. In that case, although γ-ALON is produced between the base material 1 and the upper layer 2, it will never reach the surface of the epitaxial substrate 10.

Such heating treatment for reducing dislocations according to the present preferred embodiment is effective in particular when the proportion of Al to all group III elements is 80% by mole or more, and more particularly when the group III nitride is AlN. The case where the group III nitride is AlN is most preferable in terms of quality control, because there is no problem of variations as fluctuations in composition; however, it has been confirmed that when the proportion of Al to all group III elements is 80% by mole or more, heating treatment at the same temperature as in the case of AlN will bring about a similar dislocation reduction effect so that the quality of the upper layer 2 before the heating treatment will be comparable to that in the case of AlN. If the proportion of Al to all group III elements is less than 80%, heating treatment at the same temperature as in the case of AlN will pose the problem of generation of pits due to evaporation of other group III elements such as a Ga component, which then can result in a risk of degradation of the surface flatness.

Now, in trying to reduce crystal defects, such as reducing dislocations, by executing the formation itself of the upper layer 2 of an epitaxial film of a group III nitride crystal at high temperatures comparable to those for the heat treatment according to the present preferred embodiment, it is necessary to implement the reduction of crystal defects while maintaining conditions for epitaxial growth suitably. Thus, in general, the setting of those conditions, and control of film deposition become difficult. In the present preferred embodiment, on the other hand, an epitaxial film of a group III nitride crystal is first prepared using some techniques and then heated to a high temperature. This requires no particular limitation on the condition setting and control for film deposition itself, so that there is an advantage that a good-quality group III nitride crystal can be provided.

The heat treatment according to the present preferred embodiment may be conducted immediately following the formation of a group III nitride, with the same treatment equipment, or it may be conducted separately from the nitride formation, with different equipment. In the latter case, there is an advantage that both film deposition and heating treatment can be conducted with their suitable separate equipment.

The atmosphere during heat treatment should preferably be an atmosphere containing a nitrogen element in order to prevent decomposition of a group III nitride. Examples include an atmosphere containing a nitrogen or ammonia gas. As for conditions for the pressure during heat treatment, it has been confirmed that any pressure from low to high will have the effect of reducing dislocations.

In view of the stability of the crystal structure against heating, the method of reducing dislocations according to the present preferred embodiment can work more effectively when applied to a group III nitride crystal having a wurtzite structure.

The higher the Al content of a group III nitride crystal, the more effectively dislocations can be reduced, which effect is most remarkable in the case of AlN. This is because the group III nitrides with a higher Al content, as compared to other group III nitrides such as GaN and InN, have higher melting points and thus are more resistant to degradation in crystal quality due to thermal decomposition, so that they can make the most effective use of the effect of reducing dislocations at high temperatures. The technique of the present invention is also applicable to the case of high B content because of a high melting point of BN; however, it is difficult to achieve a remarkable effect in the case of high B content because the wurtzite structure of BN itself is not a stable crystal structure.

In particular when the upper layer 2 is formed of an epitaxial film of a group III nitride with its main surface in the (0001) plane, it is possible to achieve a remarkable effect of reducing dislocations as well as to achieve, in the surface of the epitaxial substrate 10 after heat treatment, such flatness that atomic-level steps can be observed. In order to form the upper layer 2 of an epitaxial film with such a main surface, it is preferable that (0001) or (11-20) sapphire be used as the base material 1. In this case instead, it is also possible to use a substrate that is inclined slightly with respect to the aforementioned planes.

In particular when the upper layer 2 is an AlN epitaxial film with its main surface in the (0001) plane, a half width for the (0002) plane of the upper layer 2 before heat treatment, obtained by x-ray rocking curve measurement (ω scan), should preferably be 200 seconds or less, more preferably 100 seconds or less. The lower limit of the half width for the (0002) plane by the x-ray rocking curve measurement (ω scan) is not specifically defined, but it should not fall below a theoretical value (10 seconds or less) calculated from the material and the crystal structure. The achievement of such a half width means the achievement of such conditions of the surface of the upper layer 2 as small fluctuations in growth orientation, c-plane orientation in one direction, and a small number of screw dislocations. This is more preferable in forming a group III nitride crystal of good crystal quality on the upper layer 2. In order to achieve the above half width of the x-ray rocking curve, the insertion of what is called a low-temperature buffer layer on the base material 1 is undesirable, but such a thin low-temperature buffer layer that will not deteriorate the crystal quality may be inserted.

When the upper layer 2 is an AlN epitaxial film with its main surface in the (0001) plane, the edge dislocation density in the upper layer 2 before heat treatment should preferably be $5 \times 10^{10}/cm^2$ or less, which value is relatively small for the AlN epitaxial film. In the present preferred embodiment, the dislocation density is evaluated by plan-view TEM. By forming a nitride layer on the surface of the base material 1, the dislocation density in AlN before heat treatment can be kept low as described above. The reason for reducing the dislocation density before heat treatment is to achieve the effect of reducing dislocations by way of heat treatment in a quicker and more efficient manner. Depending on the conditions to be set, the dislocation density in the upper layer 2 before heat treatment can be reduced to as low as approximately $1 \times 10^9/cm^2$.

A suitable technique for forming the upper layer 2 of an AlN epitaxial film with such crystal quality and with its main surface in the (0001) plane is MOCVD or MBE where the deposition rate is at most on the order of several μm/hr. In this case, in terms of efficiency in, for example, deposition time, the film thickness should preferably be 10 μm or less, more preferably 3 μm or less. In particular when the upper layer 2 as described above is formed of trimethylaluminum and ammonia by MOCVD, the temperature of the substrate itself should preferably be 1100° C. or higher. This is because keeping the deposition rate low and increasing the temperature of the substrate itself can allow the substrate to be brought closer to its equilibrium state. In addition, the deposition pressure should preferably be a reduced atmospheric pressure of 1 Torr or more, more preferably 100 Torr or less, still more preferably 20 Torr or less; and the supply ratio of trimethylaluminum to ammonia should preferably be not greater than 1:500, more preferably not greater than 1:200. This is because the reaction of raw materials in a vapor phase can be controlled efficiently.

As for AlN with a wurtzite structure which forms the upper layer 2 as described above, its crystal structure has no center of symmetry; therefore, exchange of Al and N atoms results in reversal of crystal orientation. In other words, it is said that the polarity of a crystal depends on atomic orientation. If inversion domains, which are regions of different polarities, coexist in the surface of the upper layer 2, the boundary of the inversion domains (inversion boundary) will end in a kind of plane defect. In this case, there is a risk of the occurrence of a defect even after heat treatment due to the plane defect, which is undesirable. Thus, the upper layer 2 should preferably have the same polarity across its entire surface.

Further, in particular when AlN is used as an epitaxial film of the upper layer 2, there is a characteristic that the aforementioned dislocation reduction effect can be found not only in the surface portion, but also in the area in the vicinity of the interface between the γ-ALON layer and the group III nitride epitaxial film, at the same level as obtained in the surface portion. This is because of the fact that heat treatment can cause a plurality of edge dislocations to coalesce and disappear even in the vicinity of the interface with the substrate. This is in contrast to the case of not using the improved technique according to the present preferred embodiment, where the dislocation density in the AlN epitaxial film which is the upper layer 2 decreases gradually with increasing film thickness.

In view of this dislocation-reduced condition, in order to produce the effect of reducing the dislocation density in the epitaxial substrate 10 whose upper layer 2 is an AlN epitaxial film, the upper layer 2 should preferably have a thickness of 0.1 μm or more, with which thickness coalescence and disappearance of edge dislocations are almost terminated. This comes from the consideration that the AlN epitaxial film will be etched during heat treatment or that possible generation of a reaction layer at the interface may reduce the film thickness.

The treatment equipment for use in heating treatment may be provided therein with a member for controlling impurities in a gas, such as a hydrogen component, an oxygen component, or a carbon component. Alternatively, this impurity control function may be given to a jig for fixing the epitaxial substrate 10.

In heating treatment, a protective layer of, for example, silicon nitride may be provided on the surface of the upper layer 2 for the purpose of reducing the surface roughness due to etching control, adhesion of impurities, or excessive heat treatment at the surface of the upper layer 2. However, in particular when an AlN epitaxial film is used for the upper layer 2, its chemical stability enables stable achievement of the heat treatment effect without the use of such a protective layer.

When a semiconductor element is prepared by forming a semiconductor element layer of a group III nitride as a functional layer on the epitaxial substrate 10 according to the present preferred embodiment, the lattice constant in the main surface of the group III nitride of the semiconductor element layer should preferably be not smaller than the lattice constant in the main surface of the group III nitride of the upper layer 2. This is because, if this condition is satisfied, the semiconductor element layer will have fewer cracks so that the resultant semiconductor element can have the semiconductor element layer with higher quality. However, a great difference in lattice constant may cause dislocations at the interface between the upper layer 2 and the group III nitride of the semiconductor element layer; therefore, the lattice constant in the main surface of the group III nitride of the semiconductor element layer should preferably be not more than the lattice constant of GaN in the main surface, more preferably not more than the lattice constant of $Al_{0.2}Ga_{0.8}N$ in the main surface, still most preferably not more than the lattice constant of $Al_{0.5}Ga_{0.5}N$ in the main surface.

As described so far, in the present preferred embodiment, heating at a heating temperature that may produce a reaction product of the group III nitride crystal of the upper layer and the base material of single-crystal sapphire is performed on the epitaxial substrate for a heating time within a range that the reaction product formed will not reach the surface of the epitaxial substrate, i.e., the surface of the upper layer. This brings about the effect of reducing dislocations while maintaining such flatness that atomic-level steps can be formed at that surface.

Modifications

The aforementioned preferred embodiment has described the case where heat treatment is performed on the epitaxial substrate 10 using sapphire as the base material 1. However, in common practices of the formation of the epitaxial substrate, the base material 1 can be selected as appropriate according to the composition or structure of the upper layer 2 formed thereon or according to the method of forming each layer including the layer further formed on the upper layer 2. For instance, the base material 1 may be selected and used as appropriate from among SiC (silicon carbide) and various oxide materials such as MgO.

Even when the epitaxial substrate is formed using a base material made of any of those various materials, a similar dislocation reduction effect can be achieved if, as in the aforementioned preferred embodiment, heating even in such a temperature zone that may produce a reaction product of the group III nitride of the upper layer and the base material is conducted for a heating time within a range that the reaction product formed will not reach the surface of the epitaxial substrate.

Example

In the present example, two epitaxial substrates 10 were obtained by using (0001) sapphire as the base material 1 and forming as the upper layer 2 a (0001)-oriented AlN layer by MOCVD at 1200° C. to a thickness of 1 μm. Between the AlN layer and the base material is inserted a base nitride layer. Evaluation of the crystallinity of the AlN layer showed that the half width of the X-ray rocking curve for the (0002) plane was 70 seconds, and that for the (10-12) plane was 1100 seconds. The dislocation density was $2 \times 10^{10}/cm^2$. The X-ray rocking curve measurement was made by ω scan using an open slit. This is to measure, in the case of the (0002) plane, a tilt component of crystal fluctuations in a direction along the c-axis of AlN; and to measure, in the case of the (10-20) plane, primarily a rotational component of crystal fluctuations about the c-axis of AlN. The 5-μm-square surface roughness (ra) measured by AFM was 3 Å or less, and the AFM image showed that although atomic-level steps were observed, there were a large number of pits at the surface.

Then, the epitaxial substrates 10 were put in place in a reaction chamber of a heat treat furnace and were heat treated with the supply of a nitrogen gas under one atmospheric pressure. The heat treatment was conducted on each substrate with different combinations of heating temperature and time: (1) 1900° C. and 10 minutes; and (2) 1800° C. and 60 minutes. Those heating temperatures were temperatures that may produce a γ-ALON layer by the reaction of sapphire and AlN in an equilibrium diagram.

TEM cross-section observations of the epitaxial substrates 10 after the heat treatment confirmed that, in either of the epitaxial substrates 10, a γ-ALON layer was formed only at the interface between the AlN layer and the base material 1. Evaluations of the crystal quality of the AlN layer of each epitaxial substrate 10 after the heat treatment showed that, in either case, the half width of the X-ray rocking curve for the (0002) plane was 70 seconds, and that for the (10-12) plane was 350 seconds or shorter. In either case, the dislocation density was $1 \times 10^9/cm^2$ or less.

For the epitaxial substrates 10 that had undergone heat treatment at 1900° C., the 5-μm-square surface roughness (ra) measured by AFM was 10 Å or less, and the AFM image showed that atomic-level steps were observed clearly, but there were no pits observed.

Comparative Example 1

In the present comparative example, the same epitaxial substrates as in the above example were prepared and subjected to heat treatment at a heating temperature of 1900° C. for 30 hours. The epitaxial substrates after the heat treatment showed that an ALON layer and an AlN crystal layer coexisted in the surface. It had also been shown that the surface flatness was so degraded that atomic-level steps could not be observed.

Comparison Between Example and Comparative Example 1

The results of Example and Comparative Example 1 showed that, when heating at a heating temperature that may produce a reaction product of the group III nitride crystal of the upper layer and the base material of single-crystal sapphire was conducted for a short heating time within a range that the reaction product formed would not reach the surface of the epitaxial substrate, i.e., the surface of the upper layer, even if part of the upper layer ended in the reaction product, it is possible to obtain the epitaxial substrate with a reduced number of dislocations in the upper layer and with good surface flatness.

Comparative Example 2

In the present comparative example, two epitaxial substrates using (0001) sapphire as a base material were prepared and subjected to the same heating treatments as in Example 1 with the conditions (a) and (b). In either case, the substrates after the heat treatment showed that an ALON layer existed mainly on the interface side, and AlN and ALON coexisted on the surface side. The 5-μm-square surface roughness (ra) measured by AFM was approximately 500 Å, and grain pits and projections were observed at the surface. Evaluations of the crystal orientations showed that the crystal orientation was not in one direction so that the substrates were polycrystalline.

Comparison Between Example and Comparative Example 2

The results of Example and Comparative Example 2 showed that the use of the epitaxial substrate 10, as compared with the case of using a sapphire base material, allowed the provision of an AlN layer with excellent surface flatness and excellent crystal quality through the medium of an γ-ALON layer.

The invention claimed is:

1. A method of reducing dislocations in a group III nitride crystal which is epitaxially formed on a sapphire single-crystal base material by a film deposition technique, the method comprising:
   a step of providing a sapphire single-crystal base material;
   a step of forming said group III nitride crystal on said sapphire single-crystal base material;
   a heating step of heating said group III nitride crystal after said step of forming said group III nitride crystal, thereby to form an interfacial layer of a reaction product of said group III nitride crystal and said sapphire single-crystal base material, wherein in said heating step, heating at a heating temperature that produces said reaction product is conducted for a heating time within a range that said reaction product formed will not reach the surface of said group III nitride crystal.

2. The method of reducing dislocations in a group III nitride crystal according to claim 1, wherein
said single-crystal base material is a C-plane sapphire single crystal.

3. The method of reducing dislocations in a group III nitride crystal according to claim 1, wherein
the proportion of Al to all group III elements in said group III nitride crystal is 80% by mole or more.

4. The method of reducing dislocations in a group III nitride crystal according to claim 3, wherein
said group III nitride crystal is AlN.

5. The method of reducing dislocation in a group III nitride crystal according to claim 1, wherein said heating temperature is not less than 1800° C. and said heating time is not more than 60 minutes.

6. A substrate for epitaxial growth, comprising:

a sapphire single-crystal base material;

an upper layer of a group III nitride crystal which is epitaxially formed on said sapphire single-crystal base material; and an interfacial layer of a reaction product of said group III nitride crystal and said sapphire single-crystal base material, said upper layer and said interfacial layer being formed by undergoing heating treatment at a heating temperature that produces said reaction product and for a heating time within a range that said reaction product formed will not reach the surface of said group III nitride crystal.

* * * * *

UNITED STATES PATENT AND TRADEMARK OFFICE
CERTIFICATE OF CORRECTION

PATENT NO. : 7,771,849 B2  Page 1 of 1
APPLICATION NO. : 12/354921
DATED : August 10, 2010
INVENTOR(S) : Tomohiko Shibata and Shigeaki Sumiya It is certified that error appears in the above-identified patent and that said Letters Patent is hereby corrected as shown below:

Title Page, Item (75) Inventors: *please change* "Tomohiko Shibata, Akika (JP)"

to --Tomohiko Shibata, Akita (JP)--

Signed and Sealed this

Thirtieth Day of November, 2010

David J. Kappos
*Director of the United States Patent and Trademark Office*